United States Patent [19]

Brandt et al.

[11] 3,953,658
[45] Apr. 27, 1976

[54] COPPER COATINGS ON SHAPED PLASTIC SUPPORTS

[75] Inventors: Wilhelm Brandt, Wertach; Irmgard Bindrum, Wiesbaden-Biebrich, both of Germany

[73] Assignee: Hoechst Aktiengesellschaft, Germany

[22] Filed: Dec. 5, 1972

[21] Appl. No.: 312,269

[30] Foreign Application Priority Data

Dec. 8, 1971   Germany............................ 2160822

[52] U.S. Cl............................... 428/458; 427/123; 427/124; 427/306; 428/462; 428/474; 428/480; 428/516; 428/517; 428/518; 428/519; 428/520
[51] Int. Cl.² .......................................... B05D 5/12
[58] Field of Search................ 117/71 R, 107, 47 A; 428/458, 462, 474, 480, 516, 517, 518, 519, 520; 427/123, 124, 306

[56] References Cited
UNITED STATES PATENTS

| | | | |
|---|---|---|---|
| 2,898,228 | 8/1959 | Kelley | 117/107 |
| 3,219,471 | 11/1965 | Chilton et al. | 117/71 R X |
| 3,305,460 | 2/1967 | Lacy | 117/71 R X |
| 3,501,332 | 3/1970 | Buckman | 427/306 |
| 3,558,290 | 1/1971 | Baier et al. | 117/71 R X |
| 3,591,352 | 7/1971 | Kennedy et al. | 427/306 |
| 3,709,727 | 1/1973 | Miller | 427/306 |
| 3,767,538 | 10/1973 | Politycki et al. | 117/47 A |
| 3,799,794 | 3/1974 | Miller | 117/47 A |
| 3,881,049 | 4/1975 | Brandt et al. | 427/306 |

FOREIGN PATENTS OR APPLICATIONS 554,370   6/1943   United Kingdom............... 117/71 R

*Primary Examiner*—Cameron K. Weiffenbach
*Attorney, Agent, or Firm*—James E. Bryan

[57] ABSTRACT

This invention relates to an improvement in the process for the production of a copper coating on a shaped plastic support in which copper is vapor-deposited in a high vacuum on the surface of the plastic support, the improvement comprising coating said surface, prior to the vapor-decomposition of copper, with a layer of a conducting substance in a quantity such that the surface resistance is in the range of about 1 to less than $10^{12}$ ohm.

4 Claims, No Drawings

COPPER COATINGS ON SHAPED PLASTIC SUPPORTS

This invention relates to a process for the manufacture of articles comprising copper coatings on shaped plastic supports.

It is known to vapor-deposit copper layers in a high vacuum onto shaped supports of plastic, for example onto plastic sheets manufactured by injection molding or onto plastic films which have been produced from solution or from a melt.

These copper layers possess relatively low adhesion to the surface of the shaped plastic supports and, for example, can be easily pulled off by an applied adhesive tape. Furthermore the copper layers reveal numerous minute holes when viewed by transmitted light.

It is known, for example from German Pat. No. 1,002,584, to deposit a thin intermediate layer from a silicon monoxide atmosphere and thereby to improve the adhesion of vapor-deposited aluminum layers.

According to German Pat. No. 1,446,283, as published, a polyester film is vapor-coated, while being well cooled, with a very thin layer of a noble metal, for example silver, and subsequently with a layer of zinc. This is supposed to prevent stripe formation on the vapor-coated film.

None of the publications mentioned concerns itself with the problem of eliminating the holes; an improvement in adhesion is aimed at only in the first-mentioned patent specification, which however gives no information regarding improvement of the adhesion of copper layers.

The present invention provides a process for the manufacture of articles comprising copper coatings on shaped plastic supports, wherein the surface of the plastic support, prior to the vapor deposition thereon of copper in a high vacuum, is coated with a layer of a conducting substance, either by producing noble metal nuclei on the surface by sensitization with a noble metal salt and activation with a reducing agent, and depositing copper non-electrolytically on these nuclei, or by incorporating carbon black into the plastic surface, the conducting substance being deposited or incorporated in such a quantity that the surface resistance amounts to from 1 to less than $10^{12}$ ohm. As a result of this process, vapor-deposited copper layers are produced which show better adhesion than hitherto, and do not contain holes. Preferably, a surface resistance of less than $10^5$ ohm should be achieved. In the case of non-electrolytically deposited copper layers, surface resistances of between 1 and 100 ohm are particularly preferred.

In the case of carbon black, this material must adhere to the surfaces concerned so as to be resistant to wiping off and rubbing off. Polyester surfaces are coated, for example, with aqueous carbon black dispersions which contain trichloroacetic acid together with wetting agents. The manufacture of polyester moldings with carbon black particles embedded in the surface is described, for example, in British Pat. Specification No. 1,175,936. The coating of moldings of other plastic with firmly adhering carbon black is described, for example, in Belgian Pat. No. 739,548.

The copper layers deposited from a copper salt bath containing a reducing agent also must adhere to the plastic surface so as to resist wiping off and rubbing off if the copper layers vapor-deposited on them are not to be removable together with the non-electrolytically deposited copper layers.

Suitable plastics are, for example, polyesters, polypropylene, acrylonitrile-butadiene-styrene copolymers and polyimides. The polyesters include the polycondensation products of ethylene glycol and terephthalic acid or isophthalic acid and the polyimides include the condensation products of aromatic diamines, for example benzidine, and pyromellitic dianhydride.

The copper layers deposited on the plastic surfaces and having a surface resistance of between $10^{12}$ and 1 ohm are very thin, i.e., in general not thicker than 0.2 $\mu$m. Their surface resistance is significantly higher than that of a compact copper film which has a surface resistance of about 0.017 ohm.

The production of the thin copper layers on plastic surfaces from a non-electrolytic copper salt bath, containing reducing agent, is described, for example, in U.S. Pat. No. 3,142,581, or in German Pat. No. 1,264,921 or 1,805,282, as published. A particularly advantageous process is described in British Pat. Specification No. 58245/71. The deposition takes place on the degreased plastic surfaces after they have been activated and sensitized, i.e., provided with noble metal nuclei. In order that the formation of these thin copper layers should be controllable, the copper bath must be very slow working, i.e., the copper should deposit only very slowly on the activated and sensitized plastic surface.

A non-electrolytic copper bath which can be used for the purpose of the invention contains copper sulfate and formaldehyde as the reducing agent, the content of copper sulfate in the bath is 5 – 8 g/liter and the weight ratio of copper sulfate:formaldehyde is 1 : 1 to 1 : 0.7, preferably 1 : 0.8. The bath contains a complex-forming agent for the copper salt and a luster promoting additive; it has a pH of about 12 – 13.

Appropriately, the plastic surfaces to be metallized are subjected to a cleaning and/or a surface hydrolysis before the first step of the process according to the invention in order to achieve uniform wetting by the subsequent treatment solutions. The cleaning can be effected in a known manner with organic solvents or with acids or alkalies, for example by means of a hot aqueous chromic acid-phosphoric acid-sulfuric acid mixture or by means of 30% concentration hot sodium hydroxide solution.

After cleaning, the plastic surface is sensitized in a known manner with the solution of a noble metal salt, for example of Pd, Pt, Au or Ag and activated with the solution of a reducing agent, for example stannous chloride or hydrazine hydrate. The activation also can be carried out before the sensitization. During the activation, the noble metal is deposited from its salt. The noble metal salt content of the sensitizing baths is 0.005 to 5% by weight and the content of reducing agents in the activating baths is 0.1 – 10% by weight. Both baths are usually employed at room temperature. Silver, palladium and platinum are generally employed in ammoniacal solution and palladium, platinum and gold are also used in hydrochloric solution.

After the activation and sensitization the plastic surface is introduced into the copper bath. The plastic surface is exposed thereto until the desired surface conductivity of less than $10^{12}$ ohm has been reached. This requires about 4 – 7 minutes in the copper bath.

The copper bath is usually employed at room temperature but it can be initially employed for a short period at an elevated temperature, for example at 30°–50°C, and subsequently at room temperature.

When the plastic surface is introduced into the copper bath it generally assumes a green color which gradually changes to green-blue and then to blue-brown. Finally, the plastic surface assumes a metallic copper luster which progressively intensifies. When the metallic copper luster first appears, the plastic surface is still transparent if the support is a transparent film. As the metallic surface luster intensifies, the transparency decreases. Finally, a continuous, opaque copper layer has been deposited on the plastic surface; this is the case after about 10 – 15 minutes in the non-electrolytic copper bath.

If the surface resistance during the dwell time of the plastic surfaces in the non-electrolytic copper bath is followed, it is observed that at the instant at which the first metallic copper luster appears, the surface resistance falls abruptly from about $10^{12}$ ohm to values below $10^2$ ohm.

It has been found that both on plastic surfaces having a surface resistance of $10^{12}$ ohm and above and on plastic surfaces having a surface resistance of less than 1 ohm copper layers vapor-deposited in a high vacuum either do not adhere, or adhere much worse than on plastic surfaces with a surface resistance of less than $10^{12}$ ohm. The adhesion is best at values of $10^2$ to 1 ohm, especially 10 to 1 ohm.

The surface resistance is measured according to German Standard VDE 0303, part 3, with spring tongue electrodes on a Pontavi-Wheatstone measuring bridge by Hartmann and Braun, at 23°C and 50% relative atmospheric humidity. The spring tongues are 10 cm long and 1 cm apart.

The vapor deposition on the plastic surfaces into which carbon black has been incorporated, and the vapor deposition on the plastic surfaces carrying copper deposited in a non-electrolytic copper bath, is carried out in a high vacuum, in general at $10^{-3}$ to $10^{-5}$, for example at $10^{-4}$ mm Hg.

Vapor deposition is carried out until at least about 2 g of copper have deposited per square meter of plastic surface, corresponding to a copper layer which is at least 0.22 $\mu$m thick. At that stage, the vapor-deposited copper layer is optically completely continuous and dense. It adheres inseparably to the substrate, i.e., if a cross pattern is scratched into the copper layer and a pressure-sensitive adhesive tape is applied over this, the copper layer cannot be detached when the adhesive tape is snatched off the substrate.

If plastic surfaces without incorporated carbon black or without a copper layer deposited in a non-electrolytic copper bath are vapor-coated with copper in a high vacuum, the vapor-deposited copper layer can be easily pulled off. These vapor-deposited copper layers are not dense but are permeated by numerous minute holes.

The copper layers obtained according to the invention can be thickened in an electrolytic copper bath, for example to 2 to 20 $\mu$m. The resulting copper layers again adhere inseparably in the adhesive tape test. If high vacuum copper layers which have been vapor-deposited directly onto plastic surfaces without carbon black or without a thin non-electrolytically deposited copper layer are thickened electrolytically, the electrolytically produced coatings can be easily pulled off the plastic surface together with the vapor-deposited copper layer.

The electrolytically thickened copper layers obtained according to the invention retain their good adhesion even if they are stored for weeks at room temperature in air saturated with water vapor.

The following Examples illustrate the invention; percentages are by weight:

EXAMPLE 1

Biaxially stretched and thermoset films of polyethylene terephthalate were coated with one of the following dispersions, which had been prepared by grinding the indicated amount of carbon black with a solution of 0.05% of polyoxyethylene-lauryl-ether and the indicated amount of trichloro-acetic acid (TCE) in water in a ball mill.

| I   | 3% of carbon black   | 20% of TCE |
| --- | -------------------- | ---------- |
| II  | 4% of carbon black   | 20% of TCE |
| III | 4.5% of carbon black | 15% of TCE |

The films were dried for 10 minutes at 150°C.

The carbon black adhered to the film surfaces so as to resist wiping and rubbing. The film surfaces had the following surface resistances:

| I   | $2.3 \times 10^{11}$ ohm |
| --- | ------------------------ |
| II  | $3.1 \times 10^4$ ohm    |
| III | $8 \times 10^1$ ohm      |

The non-treated polyethylene terephthalate had a surface resistance of $7 \times 10^{14}$ ohm.

All films were vapor-coated with copper for 60 seconds in a high vacuum apparatus at $10^{-4}$ mm Hg. In the course thereof, 2.7 g of Cu/m² of film surface deposited. The thickness of the copper layer was 0.30 $\mu$m.

A cross pattern of lines 1 mm apart was scratched by means of a razor blade in the copper layers of the three films. A pressure-sensitive adhesive tape was applied. On snatching off the tape, copper did not detach from any of the films.

When a polyester film without carbon black treatment was vapor-coated with copper in a high vacuum in the same manner, almost the entire vapor-deposited copper layer adhered to the adhesive tape when the latter was pulled off.

A difference in adhesion was found after the copper layers vapor-deposited on films I - III had been electrolytically thickened to 5 $\mu$. Now the copper layer remained adhering inseparably only on films II and III; it could be partially pulled off of film I.

Similar results are obtained if a carbon black coated polyester film, such as is described in EXample 1 of Belgian Pat. No. 739,548, is used.

EXAMPLE 2

A biaxially stretched and thermoset film of polyethylene terephthalate was immersed for 1 minute at 70°C in 30% sodium hydroxide solution which contained 0.8% of saponin as a wetting agent, rinsed for 1 minute with water and immersed for 1 minute in 10% aqueous trichloroacetic acid solution, which contained 0.4% of sodium dodecylbenzenesulfonate as wetting agent, to remove the last residues of alkali. The film, while still moist, was introduced for 30 seconds into a bath which contained the following constituents in 1 liter of aqueous solution:

130 g of trichloroacetic acid
4 g of sodium dodecylbenzenesulfonate
1.5 g of $PdCl_2$ + 15 ml of concentrated hydrochloric acid
5 g of polyvinyl alcohol of K-value 30 and 12% residual acetyl group content ("Mowiol" N 30-88).

After removal from the bath, the film was dried for 2 minutes at 130°C. It was then activated for 30 seconds in an aqueous solution of 0.6% hydrazine hydrate and 1.25% of NaOH.

After the activator bath, the film was briefly rinsed with water and while still moist was introduced into a non-electrolytic copper bath of the following composition:
7.6 g of $CuSO_4 \cdot 5 H_2O$
6.3 g of formaldehyde
9.1 g of ethylenediamine tetraacetic acid 1000.0 of water
0.5 g of saccharin, and
5.0 g of NaOH.

The film was left in this bath for 20 seconds at 40°C and then for various periods at 20°C. The following Table shows the amounts of copper deposited after various bath periods, and the surface resistance of the films.

| Bath period | | g of $Cu/m^2$ | Cu thickness in μm | Surface resistance in ohms | Adhesion of the copper layer vapor-deposited in a high vacuum |
|---|---|---|---|---|---|
| 40°C seconds | 20°C minutes | | | | |
| 20 | 1 | 0.083 | 0.0094 | $1 \times 10^{14}$ | + |
| 20 | 2 | 0.16 | 0.018 | $3.5 \times 10^{12}$ | ++ |
| 20 | 3 | 0.35 | 0.039 | $1.5 \times 10^{12}$ | ++ |
| 20 | 4 | 0.64 | 0.072 | $1 \times 10^{2}$ | ++ |
| 20 | 5 | 0.67 | 0.075 | 5.9 | +++ |
| 20 | 6 | 0.70 | 0.080 | 4.5 | +++ |
| 20 | 7 | 0.84 | 0.094 | 1.5 | +++ |
| 20 | 8 | 0.90 | 0.10 | 0.32 | 0 |
| 20 | 9 | 0.98 | 0.11 | 0.45 | 0 |
| 20 | 10 | 1.05 | 0.12 | 0.27 | 0 |
| 20 | 11–12 | 1.50–1.8 | 0.17–0.20 | 0.17 | 0 |

Adhesion in the adhesive tape test

0 = no adhesion
+ = poor adhesion
++ = moderate adhesion
+++ = inseparable adhesion For comparison, the polyester film which was not pretreated had a surface resistance of $7 \times 10^{14}$ ohm. A copper layer vapor-deposited directly on this film had poor adhesion.

All films were vapor-coated in a high vacuum apparatus at $10^{-14}$ mm Hg until 2.7 g of $Cu/m^2$ of film surface had deposited. The copper layers were then optically continuous and showed no holes. In the case of the films pretreated according to the invention, having a surface resistance of between $10^{12}$ and 1 ohm, the adhesion of the vapor-deposited copper layers was better in the case of the untreated film. The three films with a surface resistance of between 5.9 and 1.5 ohm showed inseparable adhesion.

EXAMPLE 3

A polyimide film of the condensation product of diaminodiphenyl-ether and pyrromellitic dianhydride ("Kapton" H of du Pont de Nemours & Co.) was immersed for 7 minutes in a solution, heated to 70°C, of 30 g of chromic acid, 160 g of water, 475 ml of 85% phosphoric acid, 365 ml of 98% sulfuric acid and 0.05 g of perfluorooctane carboxylic acid, rinsed with water, freed from the last traces of chromic acid by 5 minutes treatment in an aqueous solution, heated to 40°C, of 3% of NaOH and 1% of sodium thiosulfate, rinsed with water, activated for 5 minutes in an aqueous solution, at 25°C, of 0.5% of stannous chloride and 0.7% of HCl, rinsed with water, for sensitization immersed for 5 minutes at 25°C in an aqueous solution of 0.05% of palladium chloride and 1.8% of HCl, rinsed with water and introduced into the non-electrolytic copper bath of Example 2 initially for 20 seconds at 40°C and then for 5 minutes at 25°C. The surface resistance of the film was 5.9 ohm.

The film was vapor-coated with 2.7 g of $Cu/m^2$ in a high vacuum at $10^{-4}$ mm Hg, as in Example 2. The vapor-deposited copper layer adhered inseparably to the substrate.

EXAMPLE 4

A 3 mm thick injection-molded polypropylene sheet was degreased, activated and sensitized, as in the case of the polyimide film in Example 3, and introduced for 5 minutes into the non-electrolytic copper bath. The surface resistance of the sheet was 4 ohms. The sheet was vapor-coated with copper for 1 minute in a high vacuum at $10^{-4}$ mm Hg. The vapor-deposited copper layer adhered inseparably even after 4 weeks' storage of the vapor-coated sheet in air saturated with water vapor.

The vapor-deposited copper layer was thickened for 4 hours at a current density of 0.08 amp/square decimeter in an electrolytic copper bath of the following composition:
230 g of $CuSO_4 \cdot H_2O$
56 g of sulfuric acid (98% conc.)
0.15 g of thiourea
0.05 g of polyoxyethylene-octylphenol-ether
2.3 g of dextrin
0.23 g of hydrogen peroxide (30% conc.)
made up to 1 liter with water. 35 g of $Cu/m^2$, corresponding to a copper layer thickness of 3.8 μm, were deposited. This thickened copper layer also adhered inseparably to the polypropylene sheet in the adhesive tape test.

When the untreated polypropylene sheet was vapor-coated with copper in a high vacuum and the coating was thickened to 3.8 μm on a part of the sheet in an electrolytic bath, both the copper layer vapor-deposited in a high vacuum and the electrolytically thickened copper layer could be easily pulled off the polypropylene sheet by means of adhesive tape.

EXAMPLE 5

A 5 mm thick sheet of a copolymer of acrylonitrile, butadiene and styrene was etched for 10 minutes with a mixture, heated to 70°C, of 30 g of chromic acid, 365 ml of sulfuric acid (98%), 475 ml of phosphoric acid (75%), 0.05 g of perfluorooctane carboxylic acid and 160 ml of water. The sheet was activated as in Example 3, sensitized and introduced for 20 seconds at 40°C, and then for 5 minutes at 20°C, into the non-electrolytic copper bath of Example 2. The surface resistance of the sheet was 5 ohms.

The sheet was vapor-coated with 2.7 g of $Cu/m^2$ in a high vacuum at $10^{-4}$ mm Hg, as in Example 2.

The vapor-deposited copper layer adhered inseparably to the substrate even after it had been thickened to 3.8 μm in an electrolytic bath.

When the untreated sheet was vapor-coated with copper in a high vacuum, the copper layer was easily removable from the substrate by means of adhesive tape.

It will be obvious to those skilled in the art that many modifications may be made within the scope of the present invention without departing from the spirit thereof, and the invention includes all such modifications.

What is claimed is:

1. A process for metallizing the surface of a shaped plastic support selected from the group consisting of polyesters, polyolefins, polyimides and acrylonitrile-butadiene-styrene copolymers comprising
    producing on said surface a conductive layer of a surface resistance in the range of about 1 to less than $10^{12}$ ohms by sensitization with a noble metal salt, activation with a reducing agent to produce noble metal nuclei and subsequent deposition of copper by contacting the said surface with an electroless copper bath at a temperature and for a period sufficient to produce a copper layer having a surface resistance in the stated range,
    and vapor-depositing copper in a high vacuum on said conductive surface to form a coating on the shaped plastic support.

2. A process according to claim 1 in which the layer of noble metal is in a quantity such that the surface resistance is less than $10^5$ ohm.

3. A process according to claim 1 in which the support coated with noble metal is vapor-coated until at least 2 grams of copper per square meter of surface are deposited.

4. A shaped plastic support having a copper coating thereon produced according to the process of claim 1.

* * * * *